(12) United States Patent
Michii et al.

(10) Patent No.: US 7,166,490 B2
(45) Date of Patent: Jan. 23, 2007

(54) SEMICONDUCTOR DEVICE WITH TERMINALS, AND METHOD OF MANUFACTURING THE SAME

(75) Inventors: Kazunari Michii, Tokyo (JP); Naoyuki Shinonaga, Nagano (JP); Shinji Semba, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 307 days.

(21) Appl. No.: 10/336,801

(22) Filed: Jan. 6, 2003

(65) Prior Publication Data

US 2004/0007783 A1 Jan. 15, 2004

(30) Foreign Application Priority Data

Jul. 10, 2002 (JP) ................................. 2002-200930

(51) Int. Cl.
H01L 21/44 (2006.01)

(52) U.S. Cl. .................... 438/101; 438/17; 438/106; 438/113

(58) Field of Classification Search .............. 438/15, 438/17
See application file for complete search history.

(56) References Cited

U.S. PATENT DOCUMENTS 5,956,601 A * 9/1999 Sato et al. ................. 438/458
5,972,729 A * 10/1999 Shimizu et al. ............. 438/34
6,117,704 A * 9/2000 Yamaguchi et al. ........ 438/100
6,150,193 A * 11/2000 Glenn ....................... 438/113
6,197,603 B1 * 3/2001 Kohno et al. ............... 438/14
6,251,695 B1 * 6/2001 Kwon ......................... 438/14
6,284,566 B1 * 9/2001 Lee et al. ................... 438/107
6,358,776 B1 * 3/2002 Takehara et al. ........... 438/113
6,875,637 B2 * 4/2005 Yoshino et al. ............ 438/125

FOREIGN PATENT DOCUMENTS

JP 61-097941 5/1986
JP 2001-203293 7/2001
JP 2001-298121 A 10/2001

* cited by examiner

Primary Examiner—Richard A. Booth
(74) Attorney, Agent, or Firm—McDermott Will & Emery LLP

(57) ABSTRACT

A plurality of semiconductor chips is mounted on a surface of a substrate to be used for manufacturing semiconductor devices. The semiconductor chips are collectively sealed with resin, thereby forming resin-sealed sections. A plurality of solder balls are formed on the back surface of the substrate such that an interval A between the closest solder balls of adjacent semiconductor chips becomes "n" times ("n" is an integer greater than 1) an interval B between the solder balls on the semiconductor chip. After the semiconductor chips have been subjected to an electrical test, the resin-sealed sections and the substrate are sliced, thus breaking the semiconductor chips into pieces.

3 Claims, 6 Drawing Sheets

SEMICONDUCTOR DEVICE WITH TERMINALS, AND METHOD OF MANUFACTURING THE SAME

BACKGROUND OF THE INVENTION

1. Field of the Invention

The invention relates to a semiconductor device with a plurality of terminals and to a method of manufacturing the device.

2. Description of the Background Art

In association with recent miniaturization of a package, a semiconductor of ball grid array (BGA) type or land grid (LGA) type, in which external electrodes are arranged in a matrix pattern on the entire back surface of a substrate, has become pervasive.

A conventional semiconductor device and a method of manufacturing the device will be described hereinbelow by reference to FIGS. 9 through 17.

FIG. 9 is a view showing a front surface of a conventional semiconductor device; FIG. 10 is a cross-sectional view of the semiconductor device shown in FIG. 9; FIG. 11 is a view showing the back surface of the semiconductor device shown in FIG. 9; FIG. 12 is a perspective view showing an interior of a resin-sealed section shown in FIG. 9; FIG. 13 is a cross-sectional view of the resin-sealed section taken along line b—b shown in FIG. 12; FIG. 14 is a view showing areas of the resin-sealed section to be sliced; FIG. 15 is an enlarged view of areas on the back side of the semiconductor device to be sliced; FIG. 16 is a cross-sectional view of sliced semiconductor devices; and FIG. 17 is a cross-sectional view of a neighborhood of a solder ball shown in FIG. 16.

In FIGS. 9 through 17, reference numeral 1 designates a substrate for manufacturing semiconductor devices; 2 designates a resin-sealed section; 3 designates solder balls; 4 designates a semiconductor chip; 5 designates a wire; 6 designates an area to be sliced; 8 designates a package; and 9 designates a land.

First, a conventional semiconductor device will be described.

As shown in FIGS. 9 and 10, a plurality of resin-sealed sections 2 are formed on the surface of a substrate 1. As shown in FIG. 11, a plurality of solder balls 3 are formed on the back surface of the substrate 1 so as to correspond to the respective resin-sealed sections 2. Specifically, as shown in FIG. 17, the solder balls 3 are formed on the back surface of the substrate 1 via corresponding lands 9.

As shown in FIGS. 12 and 13, a plurality of semiconductor chips 4 electrically connected to the substrate 1 by means of wires 5 are provided in the resin-sealed sections 2.

As shown in FIGS. 14 through 16, an area to be sliced (hereinafter called a "slice area") 6 is provided in each of the resin-sealed sections 2 located in a position between the adjacent semiconductor chips 4 (or packages 8).

As shown in FIGS. 15 and 16, the plurality of solder balls 3, which serve as terminals for external electrodes, are provided on each of the semiconductor chips 4 (or the packages 8) at uniform pitches B of, e.g., 0.8 mm. An interval C between the corresponding solder balls 3 of the adjacent packages 8 (i.e., a package-to-package pitch) is a sum of a desired package size and the width of the slice area 6. For instance, in a case where a package size is 8 mm×8 mm and the width of the slice area 6 is 0.35 mm, the package-to-package pitch C is 8.35 mm.

Next, there will now be described a method of manufacturing the above-mentioned semiconductor device.

First, the plurality of semiconductor chips 4 are mounted on the surface of the substrate 1. The substrate 1 and the semiconductor chips 4 are electrically connected by use of the wires 5.

Next, the plurality of semiconductor chips 4 are collectively sealed with resin, thus forming the resin-sealed sections 2.

Further, the lands 9 to be used for mounting solder balls are formed on the back surface of the substrate 1. The solder balls 3 are formed on the lands 9. Here, in the case of a semiconductor device of LGA, formation of the solder balls 3 is obviated.

The resin-sealed sections 2, which have been collectively molded, are sliced along the cut areas 6 by means of a dicing saw, whereby the resin-sealed sections 2 are divided into a plurality of packages (semiconductor devices) 8.

Each of the packages 8 is subjected to an electrical test.

As mentioned above, when each of the packages 8 is subjected to an electrical test, a test tool such as a test contact pin must be prepared every time a package size is different. Therefore, cost of the test tool is too high.

Further, no electrical test can be carried out during a period in which a test tool is replaced with another test tool, thereby resulting in inefficient conduction of an electrical test; that is, occurrence of so-called package switching loss.

When a package is miniaturized to an extent to be called a chip-scale package (CSP), a resultant package becomes too small or lightweight. Such packages will fall during the course of a test or transport.

A method effective for solving the problem is to simultaneously subject the plurality of semiconductor chips 4 to a test while the semiconductor chips 4 (or packages 8) are sliced into pieces or collectively sealed with resin on the substrate 1.

However, a package size has already been determined by a standardization institution, such as a Japanese Electronics and Information Technology Industries Associations). The interval C between the corresponding solder balls 3 of the adjacent packages 8 (i.e., the package-to-package pitch C) is not necessarily an integral multiple of the interval B between the solder balls 3 in the package 8 (i.e., a ball pitch). Therefore, even in the case of a package of same size, a test tool must be prepared every time the intervals B and C are changed. Thus, costs for the tool cannot be curtailed.

Moreover, when packages of different sizes are manufactured, test tools for the respective packages must be prepared, thereby hindering curtailment of costs for the tools.

Accordingly, since commonality cannot be achieved in connection with positions of terminals (e.g., solder balls) 3 on the back side of the substrate 1, a test tool must be prepared every time the interval C between the solder balls C of the adjacent packages 8 or a package size has become changed. For this reason, costs for the test tool cannot be diminished.

A necessity for replacement of test tools entails occurrence of so-called package switching loss.

SUMMARY OF THE INVENTION

The present invention has been conceived to solve the previously-mentioned problems and a general object of the present invention is to provide a novel and useful semiconductor device, and is to provide a novel and useful method of manufacturing the semiconductor device.

A more specific object of the present invention is to curtail costs for a test tool used for electrical test of semiconductor devices by establishing commonality in positions of terminals of semiconductor devices.

The above object of the present invention is attained by a following semiconductor device and a following method of manufacturing a semiconductor device.

According to one aspect of the present invention, the semiconductor device comprises a plurality of semiconductor chips mounted on a surface of a substrate. The plurality of semiconductor chips is collectively sealed with sealing resin. A plurality of terminals is formed on a back surface of the substrate, wherein an interval between the corresponding terminals of the adjacent semiconductor chips is an integral multiple of the interval between the terminals in the semiconductor chip.

According to another aspect of the present invention, in the method of manufacturing a semiconductor device, a plurality of semiconductor chips is mounted on a surface of a substrate. The plurality of semiconductor chips is collectively sealed with resin. A plurality of terminals is formed on a back surface of the substrate such that an interval between the corresponding terminals of the adjacent semiconductor chips is an integral multiple of the interval between the terminals in the semiconductor chip. The plurality of semiconductor chips is subjected to an electrical test. The resin and the substrate are sliced, thereby breaking the semiconductor chips into pieces.

Other objects and further features of the present invention will be apparent from the following detailed description when read in conjunction with the accompanying drawings.

DETAILED DESCRIPTION OF THE PREFERRED EMBODIMENTS

Figure 1:
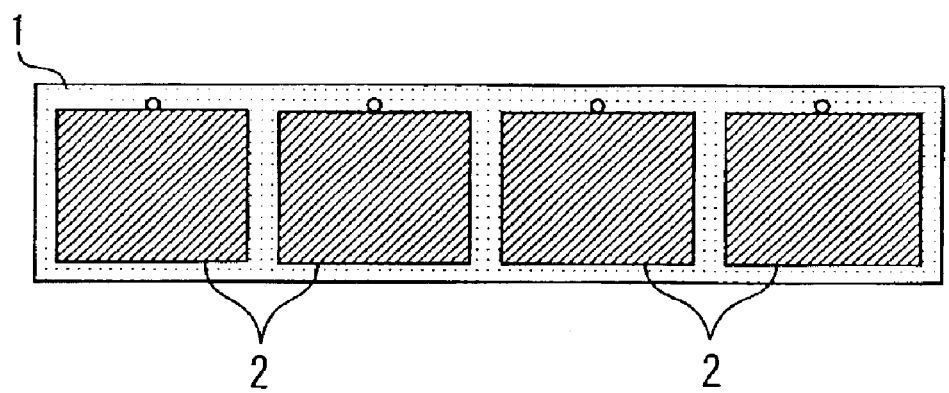
FIG. 1 is a view showing a surface of a semiconductor device according to an embodiment of the present invention.

In the following, principles and embodiments of the present invention will be described with reference to the accompanying drawings. The members and steps that are common to some of the drawings are given the same reference numerals and redundant descriptions therefore may be omitted.

By reference to FIGS. 1 through 8, a semiconductor device according to an embodiment of the invention and a method of manufacturing the semiconductor device will be described. Here, the present embodiment describes an example in which a BGA substrate is used as a substrate for use in manufacturing a semiconductor device.

Figure 2:
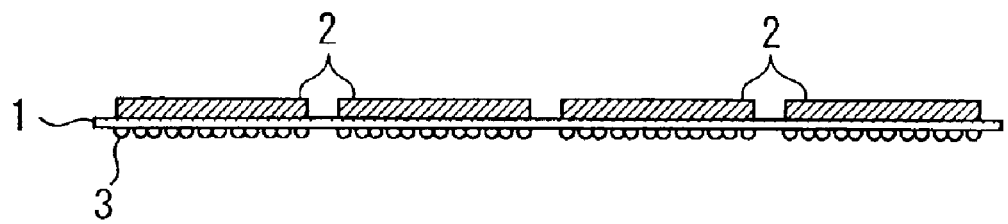
FIG. 2 is a cross-sectional view of the semiconductor device shown in FIG. 1.
Figure 3:
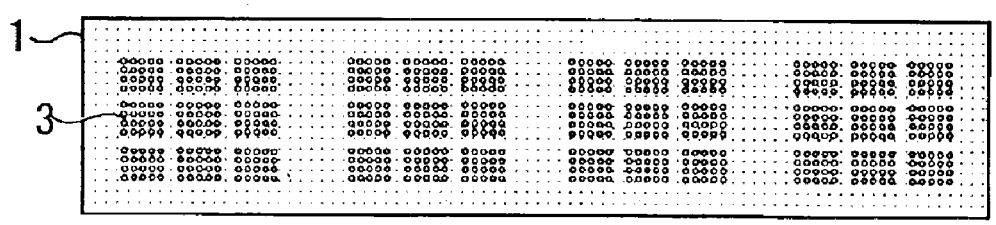
FIG. 3 is a view showing a back surface of the semiconductor device shown in FIG. 1.
Figure 4:
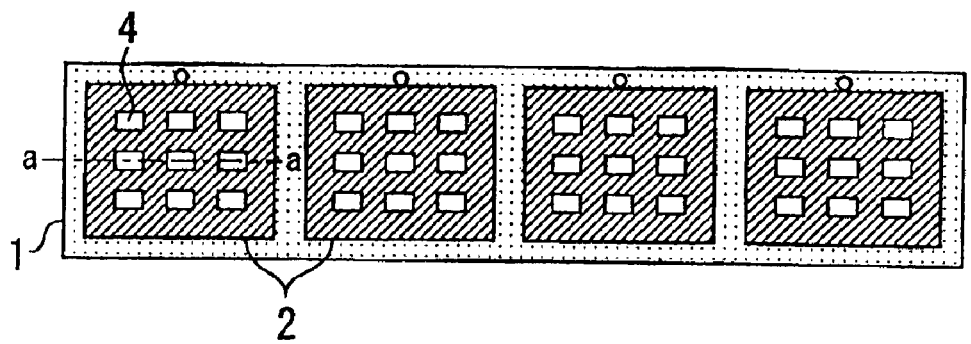
FIG. 4 is a perspective view showing an interior of a resin-sealed section shown in FIG. 1.
Figure 5:
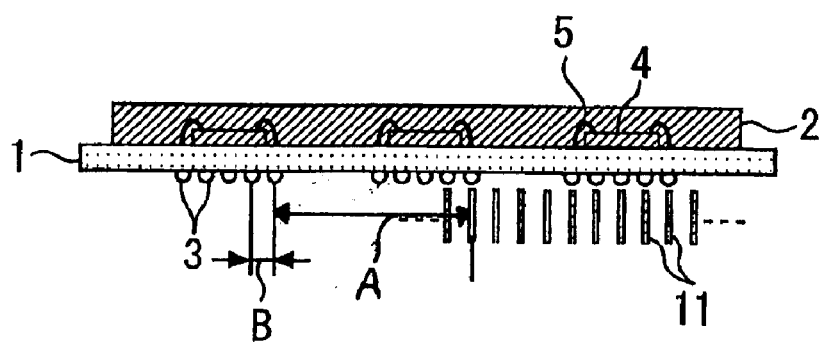
FIG. 5 is a cross-sectional view of the resin-sealed section taken along a—a shown in FIG. 4.
Figure 6:
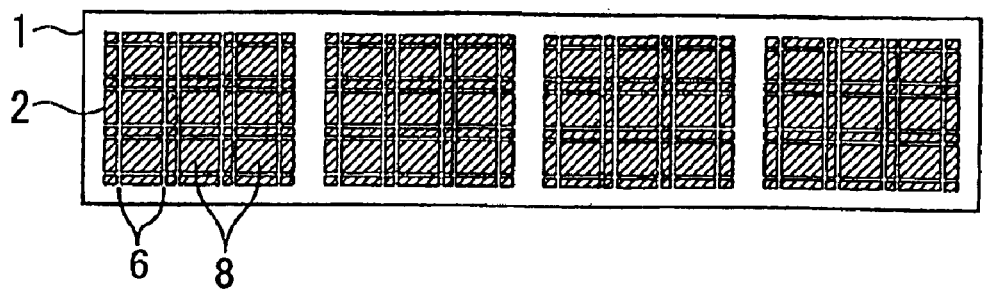
FIG. 6 is a view showing areas of the resin-sealed section to be sliced.
Figure 7:
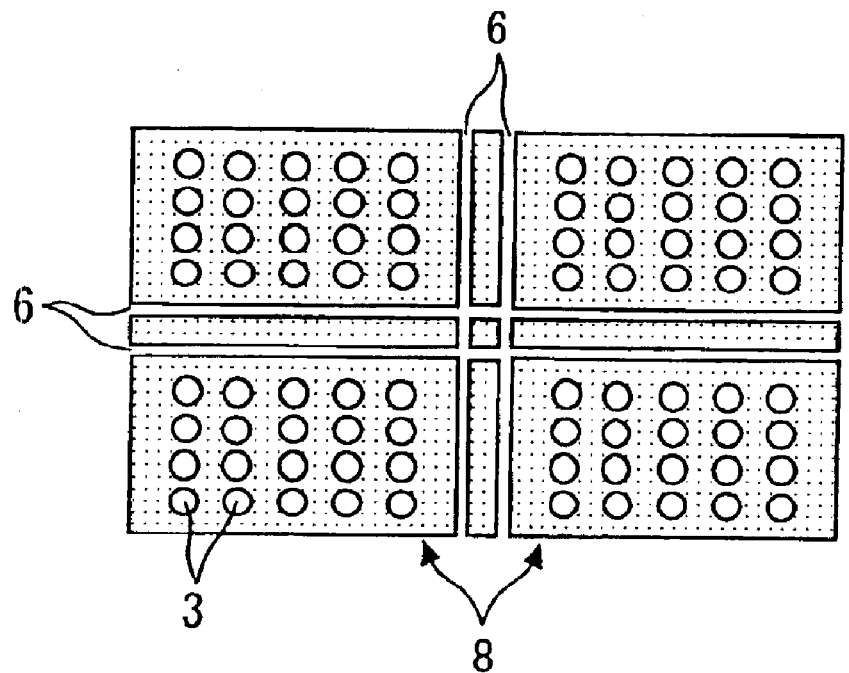
FIG. 7 is an enlarged view of the sliced section on the back surface of the semiconductor device.
Figure 8:
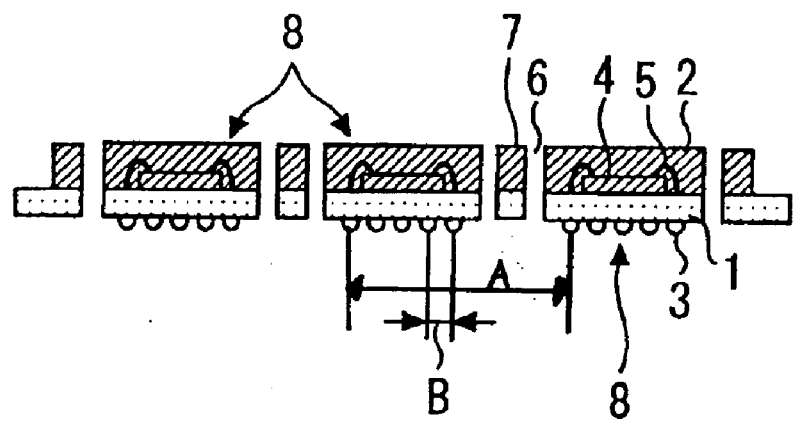
FIG. 8 is a cross-sectional view of the sliced semiconductor device.
Figure 9:
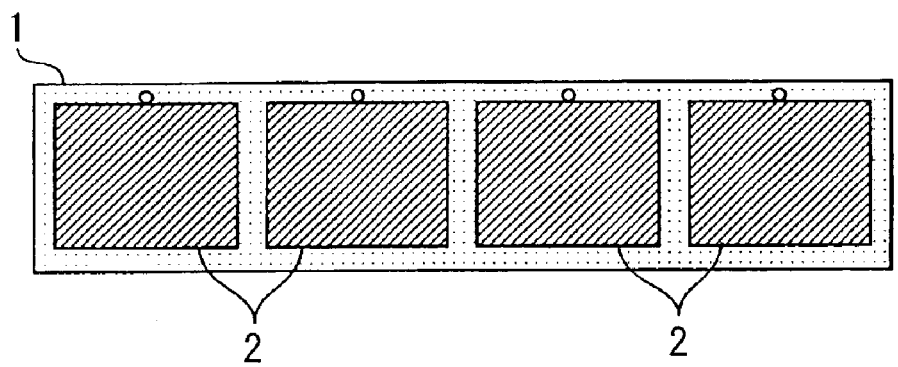
FIG. 9 is a view showing a front surface of a conventional semiconductor device.
Figure 10:
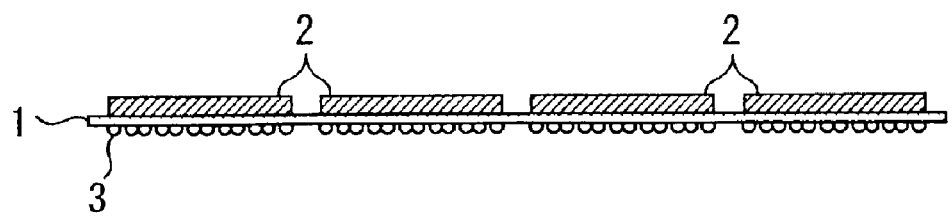
FIG. 10 is a cross-sectional view of the semiconductor device shown in FIG. 9.
Figure 11:
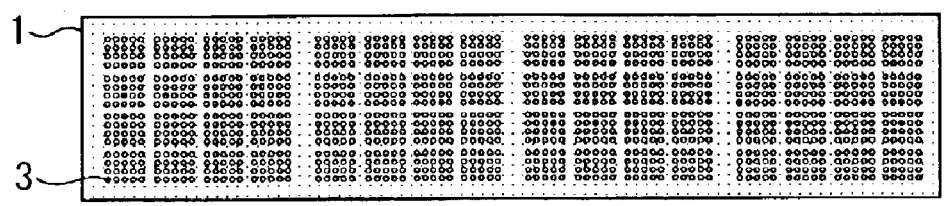
FIG. 11 is a view showing the back surface of the semiconductor device shown in FIG. 9.
Figure 12:
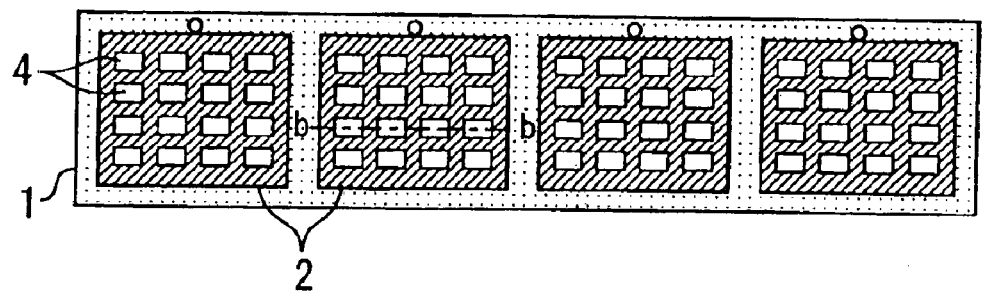
FIG. 12 is a perspective view showing an interior of a resin-sealed section shown in FIG. 9.
Figure 13:
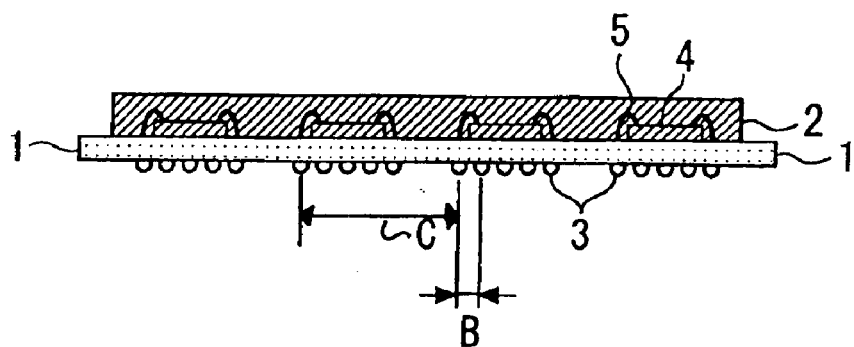
FIG. 13 is a cross-sectional view of the resin-sealed section taken along line b—b shown in FIG. 12.
Figure 14:
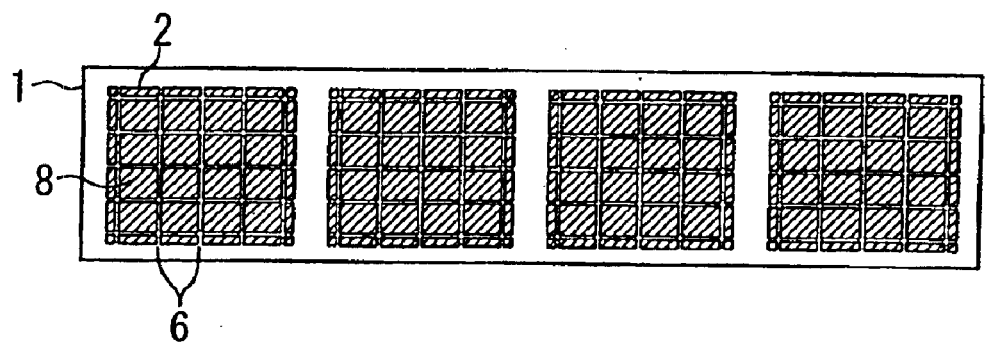
FIG. 14 is a view showing areas of the resin-sealed section to be sliced.
Figure 15:
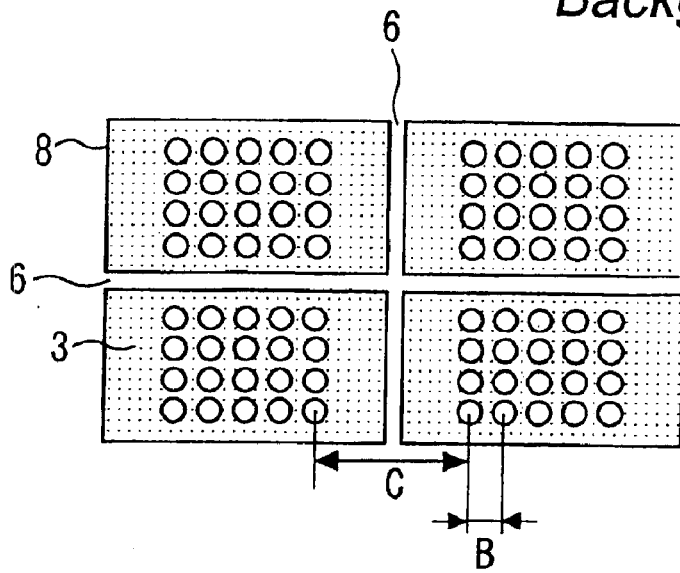
FIG. 15 is an enlarged view of areas on the back side of the semiconductor device to be sliced.
Figure 16:
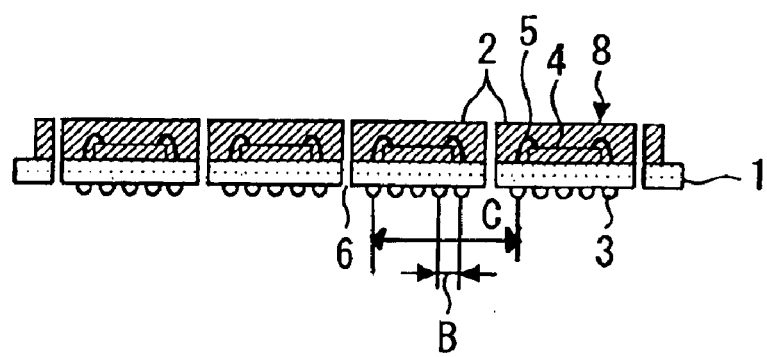
FIG. 16 is a cross-sectional view of sliced semiconductor devices.

FIG. 1 is a view showing a surface of a semiconductor device according to an embodiment; FIG. 2 is a cross-sectional view of the semiconductor device shown in FIG. 1; FIG. 3 is a view showing a back surface of the semiconductor device shown in FIG. 1; FIG. 4 is a perspective view showing an interior of a resin-sealed section shown in FIG. 1; FIG. 5 is a cross-sectional view of the resin-sealed section taken along a—a shown in FIG. 4; FIG. 6 is a view showing areas of the resin-sealed section to be sliced; FIG. 7 is an enlarged view of the sliced section on the back surface of the semiconductor device; and FIG. 8 is a cross-sectional view of the sliced semiconductor device.

In FIGS. 1 through 8, reference numeral 1 designates a substrate for use in manufacturing a semiconductor device (hereinafter referred to as a "substrate"); 2 designates resin-sealed sections; 3 designates a solder ball (terminal); 4 designates a semiconductor chip; 5 designates a wire; 6 designates an area to be sliced (hereinafter referred to as a "slice area"); 7 designates a residual remainder; 8 designates a package (semiconductor device); and 11 designates a test contact pin.

First, a semiconductor device of the embodiment will be described.

As shown in FIGS. 1 and 2, a plurality of resin-sealed sections 2 are formed on the surface of the substrate 1. Further, as shown in FIGS. 4 and 5, a plurality of semiconductor chips 4 electrically connected to the substrate 1 by means of wires 5 are provided in the resin sealed sections 2.

Figure 17:
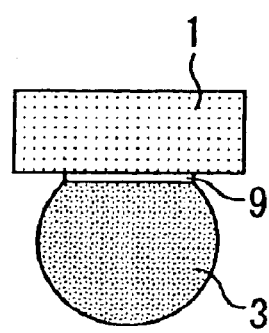
FIG. 17 is a cross-sectional view of a neighborhood of a solder ball shown in FIG. 16.

As shown in FIGS. 3 and 5, a plurality of solder balls 3 serving as external electrode terminals are formed on the back surface of the substrate 1 so as to correspond to the semiconductor chips 4 provided in the resin-sealed sections 2. Here, the solder balls 3 are arranged such that an interval A between the corresponding solder balls 3 of the adjacent semiconductor chips 4 (or the adjacent packages 8) becomes "n" times (where "n" is an integer greater than 1) an interval B between the solder balls 3 provided in one semiconductor chip 4 (or one package 8). For instance, a package size is 0.8 mm×0.8 mm, and the interval A assumes a value of 9.6 mm (=0.8 mm×12), and the interval B assumes a value of 0.8 mm. Each of the solder balls 3 is formed on the back surface of the substrate 1 through a land (9) electrically connected to the semiconductor chip 4 (see FIG. 17). The value of "n" is usually set within a range of 2 to 20. In short, the interval A is set so as to become two to twenty times the interval B.

As shown in FIG. 5, the test contact pins 11 are arranged in a grid pattern at an interval identical with the interval B (e.g., 0.8 mm) between the solder balls 3. A semiconductor device is subjected to an electrical test through use of the test contact pins 11 (which will be described later).

As shown in FIGS. 6 through 8, two slice areas 6 to be sliced by a dicing saw are formed between the adjacent semiconductor chips 4 in the resin-sealed section 2 and on the substrate 1. An area defined between the two slice areas 6; that is, a space between the semiconductor chips 4 (or packages 8), corresponds to the residual remainder 7. The size of the residual remainder 7 changes in accordance with a desired package size. In other words, a desired package is obtained by changing the size of the residual remainder 7. For instance, in the case of the foregoing package size, the width of the slice area 6 assumes a value of 0.35 mm; and the width of the residual remainder 7 assumes a value of 0.9 mm.

A method of manufacturing the semiconductor device will now be described.

First, as shown in FIGS. 4 and 5, a plurality of semiconductor chips 4 are mounted on the surface of the substrate 1. The substrate 1 is electrically connected to the semiconductor chips 4 by use of the wires 5.

Next, the semiconductor chips 4 are collectively sealed with resin, thereby forming the resin-sealed sections 2.

A plurality of lands 9 (see FIG. 17), which are electrically connected to the semiconductor chips 4 and are to be used for mounting the solder balls, are formed on the back surface of the substrate 1. The semiconductor balls 3 are formed on the lands. Here, the lands 9, which act as terminals for external electrodes, and the solder balls 3 are arranged such that the interval A between the corresponding terminals of the adjacent semiconductor chips 4 becomes "n" times (where "n" is an integer greater than 1) the interval B between the terminals provided in one semiconductor chip 4 (or one package 8). For instance, a package size is 8 mm×8 mm, and the lands and the solder balls 3 are formed such that the interval A assumes a value of 9.6 mm (=0.8 mm×12) and such that the interval B assumes a value of 0.8 mm.

The semiconductor chips 4 are simultaneously subjected to an electrical test while the chips 4 are mounted on the substrate 1. As shown in FIG. 5, the electrical test is carried out by use of the test contact pins 11 arranged in a grid pattern at the same interval as the interval B (e.g., 0.8 mm) between the semiconductor balls 3.

After the electrical test has been completed, the slice areas 6 formed on the resin-sealed sections 2 and the substrate 1 through use of a dicer. Here, in order to obtain a desired package size, the slice areas 6 are sliced twice such that the residual remainder 7 has a desired width of, e.g., 0.9 mm, between the adjacent semiconductor chips 4 (or the adjacent packages 8). As a result, the packages 8 are separated into pieces.

As has been described, in the first embodiment, commonality has been established in connection with positions of terminals such that the interval A between the corresponding terminals (i.e. the lands 9 and the solder balls 3) of the adjacent semiconductor chips 4 becomes "n" times ("n" is an integer greater than 1) the interval B between terminals of the semiconductor chip 4. Hence, so long as there are prepared the test contact pins 11 of single type, which are arranged in a grid pattern at the same interval as that between the interval B between terminals of the semiconductor chip 4, an electrical test can be carried out through use of the same test contact pins 11 even when the size of semiconductor packages fabricated in the resin-sealed section 2 is varied. Hence, costs for the test tool can be curtailed significantly.

Moreover, an electrical test can be efficiently carried out during a period of time required for replacing a test tool with another tool; that is, without involvement of occurrence of a packaging replacement loss.

Since the plurality of packages 8 (or the semiconductor chips 4) can be simultaneously subjected to a test while remaining on the substrate, productivity of the electrical test can be improved considerably. In addition, even when a package is miniaturized, there can be prevented falling of packages, which would otherwise be caused during the course of an electrical test or during the course of transport.

In the embodiment, the residual remainders 7 are left at the time of separation of the packages 8 into pieces, thereby slicing the resin-sealed sections 2 and the substrate 1 twice. Hence, even when an attempt is made to achieve commonality in connection with the positions of terminals, a semiconductor device of a desired package size is obtained.

The embodiment has described a case where a BGA substrate is used as a substrate for use in manufacturing semiconductor devices; i.e., packages of BGA types. However, the invention is not limited to such an embodiment and may also be applied to a package of LGA. In such a case, the solder balls 3 must be formed as terminals.

This invention, when practiced illustratively in the manner described above, provides the following major effects:

According to the present invention, commonality has been established between positions of terminals of a semiconductor substrate, thereby curtailing costs for a test tool used for electrical test of the semiconductor device.

Further, the present invention is not limited to these embodiments, but variations and modifications may be made without departing from the scope of the present invention.

The entire disclosure of Japanese Patent Application No. 2002-200930 filed on Jul. 10, 2002 containing specification, claims, drawings and summary are incorporated herein by reference in its entirety.

What is claimed is:

1. A method of manufacturing a semiconductor device, comprising the steps of:

providing a substrate having a front surface, a back surface opposite the fornt surface, the substrate having a first set of terminals formed on the back surface and a second set of terminals formed on the bac surface, wherein an interval between adjacent first and second sets of terminals is an integral multiple of an interval between terminals of the first set of terminals;

mounting a first semiconductor chip on the front surface and electrically connected with the first set of terminals, mounting a second semiconductor chip on the front surface and electrically connected with the second set of terminals;

collectively sealing the first semiconductor chip and the second semiconductor chip with resin to form a resin covered structure;

electrically testing the first semiconductor chip and the second semiconductor chip by contacting a test tool with the first terminals and the second terminals;

slicing twice the substrate and the sealing resin between the first terminals and the second terminals so as to separate the resin covered structure into a first semiconductor device having the first semiconductor chip and the first terminals, a second semiconductor device having the second semiconductor chip and the second terminals, and a residual remainder of the structure between the first semiconductor device and the second semiconductor device.

2. The method of manufacturing a semiconductor device according to claim 1, wherein the first set of terminals and the second set of terminals comprise solder balls to serve as terminals for external electrodes.

3. The method of manufacturing a semiconductor device according to claim 1, wherein the slicing step comprises cutting the substrate and the sealing resin twice by a dicer.

* * * * *